(12) United States Patent
Ma et al.

(10) Patent No.: US 6,667,919 B1
(45) Date of Patent: Dec. 23, 2003

(54) SEMICONDUCTOR MEMORY DEVICE AND TEST METHOD THEREOF USING ROW COMPRESSION TEST MODE

(75) Inventors: David Suitwai Ma, Cary, NC (US); Paul Edward Brucke, Durham, NC (US); Rainer Hoehler, Durham, NC (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/256,181

(22) Filed: Sep. 26, 2002

(51) Int. Cl.$^7$ ................................................. G11C 7/00
(52) U.S. Cl. ........................................ 365/201; 365/203
(58) Field of Search ................................... 365/201, 203, 365/207, 189.09, 202

(56) References Cited

U.S. PATENT DOCUMENTS

| | | | |
|---|---|---|---|
| 5,946,251 A | * | 8/1999 | Sato et al. .................. 365/203 |
| 6,275,429 B1 | * | 8/2001 | Bae et al. .................... 365/203 |
| 6,373,763 B1 | * | 4/2002 | Taito et al. .................. 365/203 |

* cited by examiner

*Primary Examiner*—Anh Phung (57) ABSTRACT

A circuit and method for testing a semiconductor memory device using a row compression test mode is provided. The testing circuit includes at least one equalizer circuit for supplying a first voltage level to one of at least one true bitline or at least one complement bitline during a test mode; an equalizing line for coupling a plurality of equalizer circuits along a wordline; and a comparator for comparing a second voltage on the equalizing line during the test mode to a reference voltage, wherein if the second voltage is less than the reference voltage, the wordline is defective.

24 Claims, 6 Drawing Sheets

SEMICONDUCTOR MEMORY DEVICE AND TEST METHOD THEREOF USING ROW COMPRESSION TEST MODE

BACKGROUND OF THE INVENTION

1. Field of the Invention

The present invention relates generally to semiconductor device design, and more particularly, to a semiconductor memory device and method for testing the memory device using a row compression test mode.

2. Description of the Related Art

Figure 1:
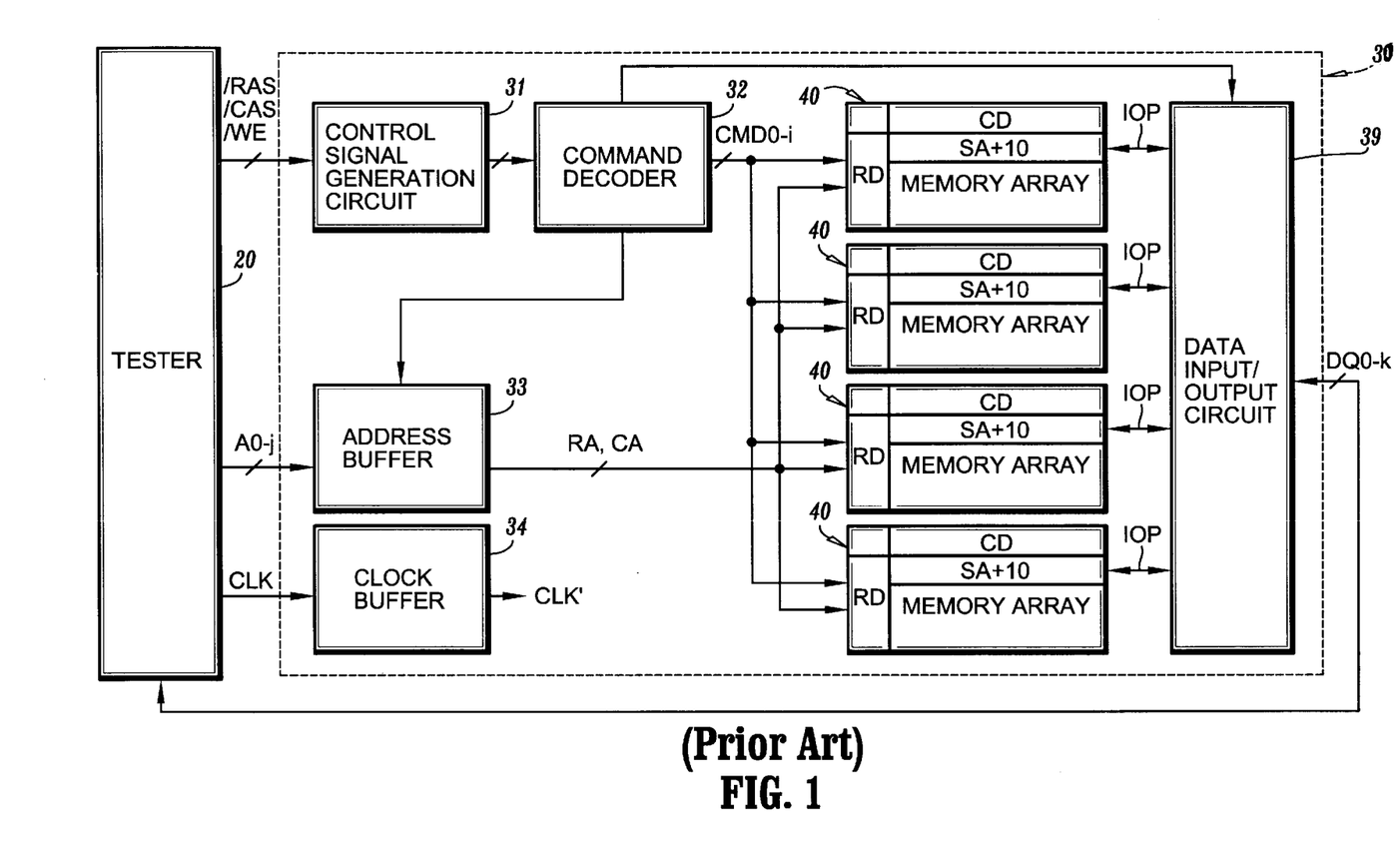
FIG. 1 is a block diagram of a conventional semiconductor memory device, e.g. a DRAM, connected to an external tester.

FIG. 1 is a block diagram showing a structure of a dynamic random access memory (hereinafter referred to as DRAM) 30 connected to a tester 20. The DRAM 30 includes a control signal generation circuit 31, a command decoder 32, an address buffer 33, a clock buffer 34, a plurality of storage devices 40 and a data input/output circuit 39. Each of the plurality of storage devices includes a memory array, a row decoder (RD), a column decoder (CD), and a sense amplifiers+input/output control circuit (SA+IO).

Control signal generation circuit 31 receives a variety of control signals such as /RAS, /CAS and /WE supplied from an external source, e.g., the external tester 20, and generates and supplies a variety of internal control signals to command decoder 32. Command decoder 32 decodes these internal control signals, generates a variety of command signals CMD0-CMDI and controls DRAM 30 as a whole by these command signals.

Address buffer 33 takes in address signals A0–Aj and supplies row address signals RA and column address signals CA to row decoders RDs and column decoder CDs, respectively. Clock buffer 34 receives a clock signal CLK supplied from an external source, generates and supplies to DRAM 30 as a whole an internal clock signal CLK'. DRAM 30 operates in synchronization with internal clock signal CLK'.

Row decoders RDs designate row addresses of memory arrays in response to row address signals RA supplied from address buffer 33. Column decoders CDs designate column addresses of memory arrays in response to column address signals CA supplied from address buffer 33.

Sense amplifiers+input/output control circuits SA+IO connect memory cells at addresses designated by row decoders RDs and column decoder CDs, respectively, to one ends of data input/output line pairs IOPs. Another ends of data input/output line pairs IOPs are connected to data input/output circuit 39. Data input/output circuit 39 supplies data DQ0-k input from an external source to a selected memory cell via data input/output line pair IOP in a writing mode, and supplies as an output data DQ0-k read from a selected memory cell to an external device in a reading mode.

Figure 2:
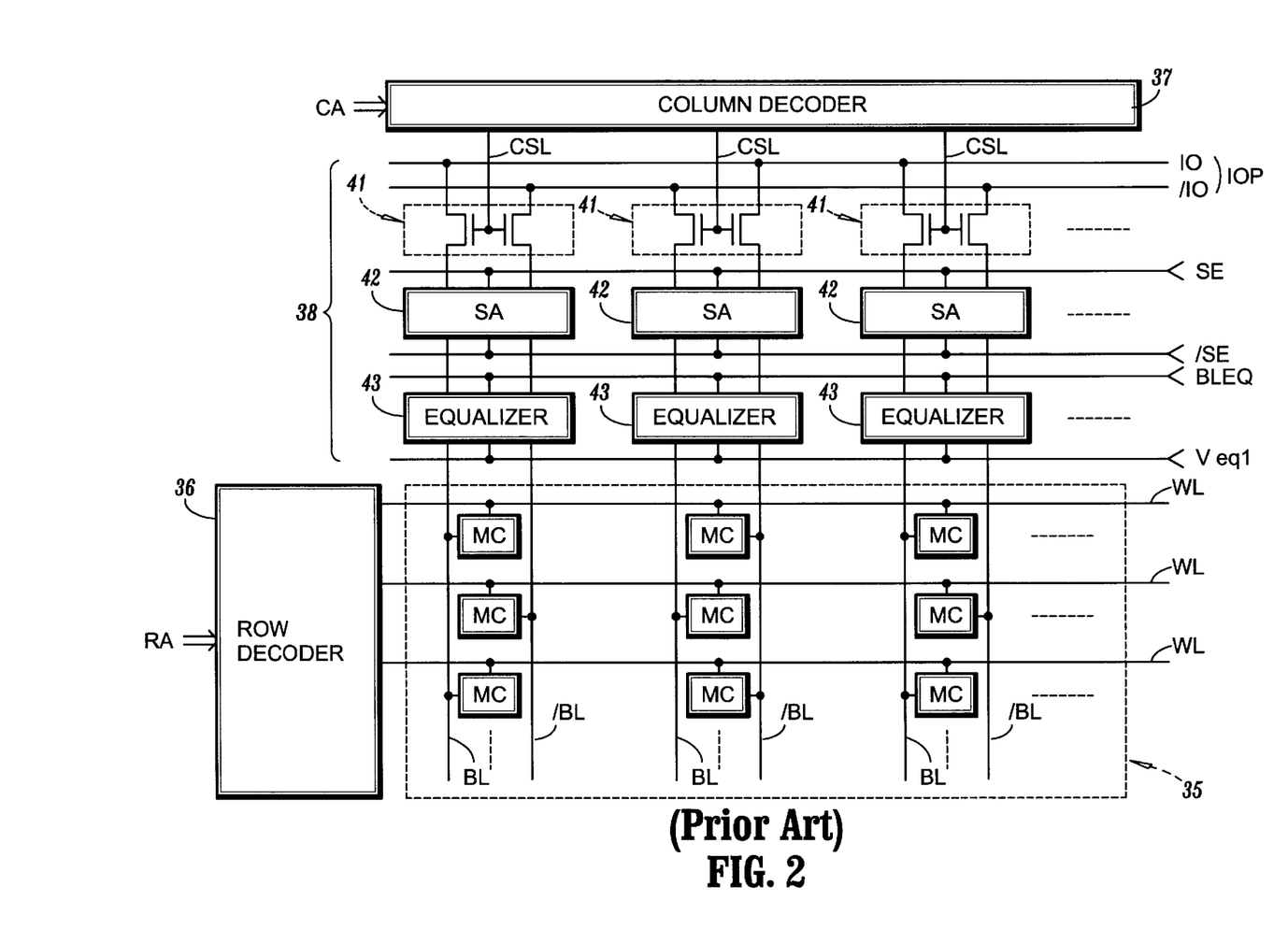
FIG. 2 is a detailed block diagram of the memory array, row decoder, column decoder and sense amplifier+input/output circuit shown in FIG. 1.
Figure 3:
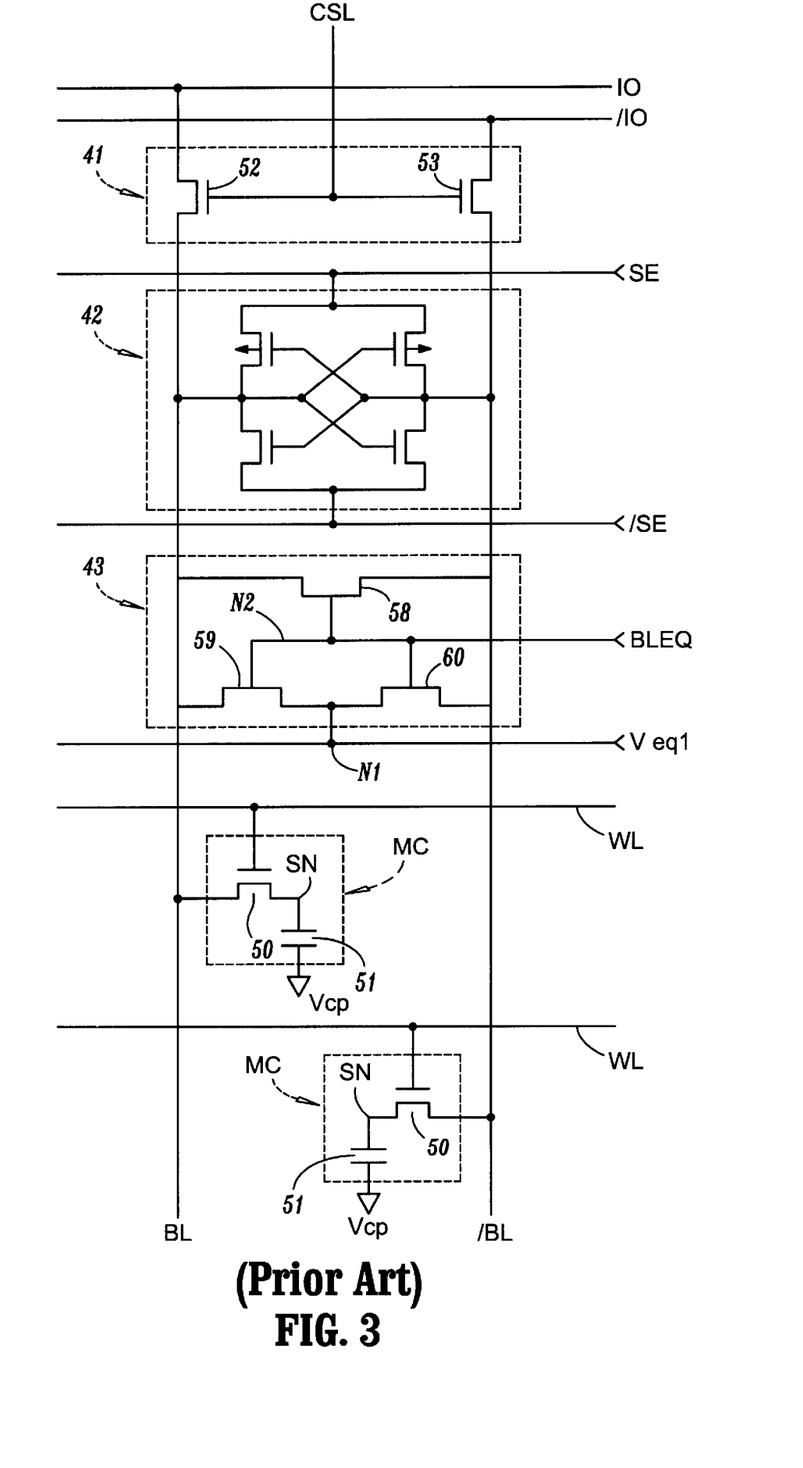
FIG. 3 is a schematic diagram of a single column of the memory device shown in FIG. 2.

FIG. 2 is a more detailed block diagram of one of the plurality of storage devices 40 and FIG. 3 is a schematic diagram of an individual column of the storage device shown in FIG. 2

With reference to FIGS. 2 and 3, memory array 35 includes a plurality of memory cells MCs arranged in a matrix, word lines WLs arranged for respective rows, and bit line pairs BLs, /BLs (true bitlines/complement bitlines) arranged for respective columns. Each memory cell MC is located at a certain address designated by a row address RA and a column address CA. Each memory cell MC is of a well known type in the art and includes an N channel MOS transistor 50 for accessing, and a capacitor 51 for storing information. The word line WL transmits an output from row decoder 36, and activates the memory cells MCs of the selected row. Bit line pair BL, /BL performs input/output of data to and from the selected memory cell MC.

Sense amplifier+input/output control circuit SA+IO 38 includes column select gates 41s, sense amplifiers 42s and equalizers 43s arranged corresponding to respective columns. Column select gate 41 includes a pair of N channel MOS transistors 52, 53 connected between bit line pair BL, /BL and data input/output line pair IO, /IO. A gate of each N channel MOS transistor is connected to column decoder 37 via a column select line CSL. When column select line CSL is activated by column decoder 37 to an "HI"(logical high) level which is a select level, the pair of N channel MOS transistors is rendered conductive coupling bit line pair BL, /BL and data input/output line pair IO, /IO.

Sense amplifier 42 amplifies a small potential difference between the bit line pair BL and /BL to a power supply voltage Vcc, in response to sense amplifier activating signals SE and /SE attaining "HI" and "L" levels, respectively.

Equalizer 43 includes an N channel MOS transistor 58 connected between bit lines BL and /BL, and N channel MOS transistors 59 and 60 connected between bit lines BL, /BL and a node N1, respectively. N channel MOS transistors 58 to 60 have their gates connected to node N2. Node N2 receives a bit line equalizing signal BLEQ, and node N1 receives a bit line potential Veql (=Vcc/2). Equalizer 43 equalizes the potentials of bit lines BL and /BL to bit line potential Veql in response to the bit line equalizing signal BLEQ attaining to the active level of "H" level. Here, signals SE, /SE, BLEQ are included in command signals CMDO-CMDi shown in FIG. 1.

Next, an operation of DRAM 30 will be briefly described. In the writing mode, one of column decoders 37 activates column select line CSL in a column corresponding to column address signal CA to an activation level, that is an "H" level, rendering column select gate 41 conductive.

Data input/output circuit 39 supplies data to be written supplied from an external source to a bit line pair BL, /BL of the selected column via data input/output line pair IOP. Data to be written is given as a potential difference between bit line BL and complement bit line /BL. Then, one of row decoders 36 activates word line WL of a row corresponding to row address signal RA to an "H" level, that is the select level, rendering the row of N channel MOS transistors 51 of the memory cells MCs in the word line conductive. Electric charges of an amount corresponding to the potential of bit line BL or /BL is stored in the capacitor 51 of the selected memory cell MC.

In the reading mode, first, bit line equalization signal BLEQ is pulled down to an "L" level and the equalization of bit lines BL and /BL is stopped. One of row decoders 36 pulls up a word line WL of a row corresponding to row address signal RA to an "H" level that is the select level. The potentials of bit lines BL and /BL change by a minor amount according to the amount of electric charges in a capacitor 51 of an activated memory cell MC.

Then, sense amplifier activation signals SE and /SE attain an "H" level and "L" level, respectively and sense amplifier 42 is activated. When the potential of bit line BL is higher than the potential of complement bit line /BL by a minor amount, the potential of bit line BL is pulled up to an "H" level and the potential of complement bit line /BL is pulled down to an "L" level. Conversely, when the potential of bit line /BL is higher than the potential of bit line BL by a minor amount, the potential of complement bit line /BL is pulled up to an "H" level and the potential of bit line BL is pulled down to an "L" level.

One of column decoders 37 then activates column select line CSL of a column corresponding to column address signal CA to an "H" level rendering column select gate 41 of the column conductive. Data of bit line pair BL, /BL of the selected column is supplied to data input/output circuit 39 via column select gate 41 and data input/output line pair IO, /IO. Data input/output circuit 39 supplies read data to an external device, e.g., tester 20.

To guarantee the quality of a DRAM, a variety of tests are performed before delivery. To test the memory cells in the DRAM array, a pattern of 1's and 0's is written into the array, and then it is read out by a cycle of normal read operations as described above. To test every cell, enough read operations must be performed to cover all addresses. However, this takes a considerable amount of time.

SUMMARY OF THE INVENTION

Accordingly, it is an aspect of the present invention to provide an equalizer testing circuit for a semiconductor memory device, the equalizer testing circuit including at least one equalizer circuit for supplying a first voltage level to one of at least one true bitline or at least one complement bitline during a test mode; an equalizing line for coupling a plurality of equalizer circuits along a wordline; and a comparator for comparing a second voltage on the equalizing line during the test mode to a reference voltage, wherein if the second voltage is less than the reference voltage, the wordline is defective.

It is another aspect of the present invention to provide a semiconductor memory device including a memory cell array including a plurality of wordlines, a plurality of bitlines, and a plurality of memory cells each being located at intersections of the wordlines and the bitlines; a row decoder circuit for selecting one of the wordlines in response to a row address; a column decoder circuit for selecting at least one of pairs of the bitlines in response to a column address; a switching circuit for connecting a bitline pair selected by the column decoder circuit with a corresponding sense amplifier; and an equalizer testing circuit including at least one equalizer circuit for supplying a first voltage level to one of at least one true bitline or at least one complement bitline during a test mode; an equalizing line for coupling a plurality of equalizer circuits along a wordline; and a comparator for comparing a second voltage on the equalizing line during the test mode to a reference voltage, wherein if the second voltage is less than the reference voltage, the wordline is defective.

In a further aspect of the present invention, a method for testing a semiconductor memory device is provided. The method including the steps of activating a wordline such that all true bitlines or complement bitlines along the wordline have a first voltage; connecting a sense amplifier to an equalizing test circuit; precharging an equalizing line to the first voltage; supplying a second voltage to the equalizing test circuit; and comparing a voltage of the equalizing line to a reference voltage, wherein if the equalizing line voltage is less than the reference voltage, the wordline is defective.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

During the activation of a wordline, data from every memory cell of an array activated by the wordline is read into a corresponding sense amplifier. The present invention utilizes this fact to realize this data could be compared local to the sense amplifiers to determine if any memory cells on the wordline are failing. In this way, all memory cells associated with a particular wordline could be tested in one operation, i.e., a row compression test mode, instead of testing each memory cell individually thereby reducing test time of a semiconductor memory device. To reduce the additional area required for performing the row compression test on a die of the memory device, a maximum usage of existing transistors in the sense amplifier area is targeted. The equalizer circuit has been identified to be suitable for this task.

Figure 4:
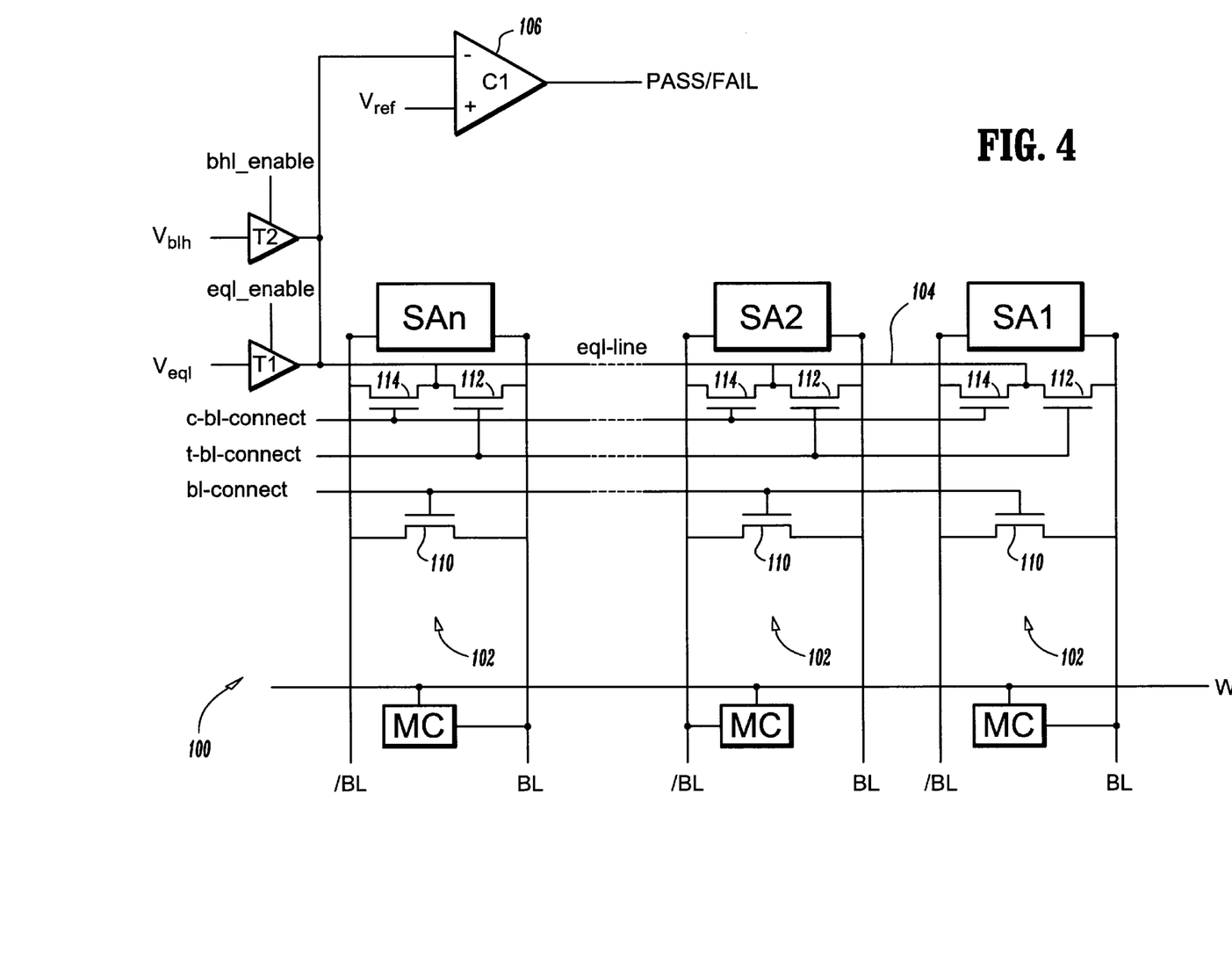
FIG. 4 is a schematic diagram of an equalizer testing circuit for a semiconductor memory device in accordance with the present invention.

Referring to FIG. 4, an equalizer testing circuit 100 is provided for testing of wordlines WL of a semiconductor memory device. The equalizer testing circuit 100 includes a modified equalizer circuit 102 for supplying a first voltage level to one of a true bitline BL or a complement bitline /BL during a test mode, an equalizing line 104 (also referred to as eql-line) for coupling a plurality of equalizer circuits 102 along a wordline WL; and a comparator 106 for comparing a second voltage on the equalizing line 104 during the test mode to a reference voltage Vref to determine if any element along the wordline WL is defective. The equalizing test circuit 100 further includes a first tri-state register T1 for enabling the equalizing line 104 during the test mode and a normal operation mode and a second tri-state register T2 for precharging the equalizing line 104 during the test mode.

The equalizer circuit 102 includes three switches 110, 112, 114, preferably N channel MOS transistors. The first transistor 110 is coupled between a true bitline BL and a complement bit line /BL, where a gate of the first transistor 110 is coupled to a first connection line bl-connect. The second transistor 112 is coupled between the true bitline BL and the third transistor 114, with a gate of the second transistor 112 being coupled to a second connection line t-bl-connect. Finally, the third transistor 114 is coupled between the second transistor 112 and the complement bitline /BL, with its gate being coupled to a third connection line c-bl-connect.

Figure 5:
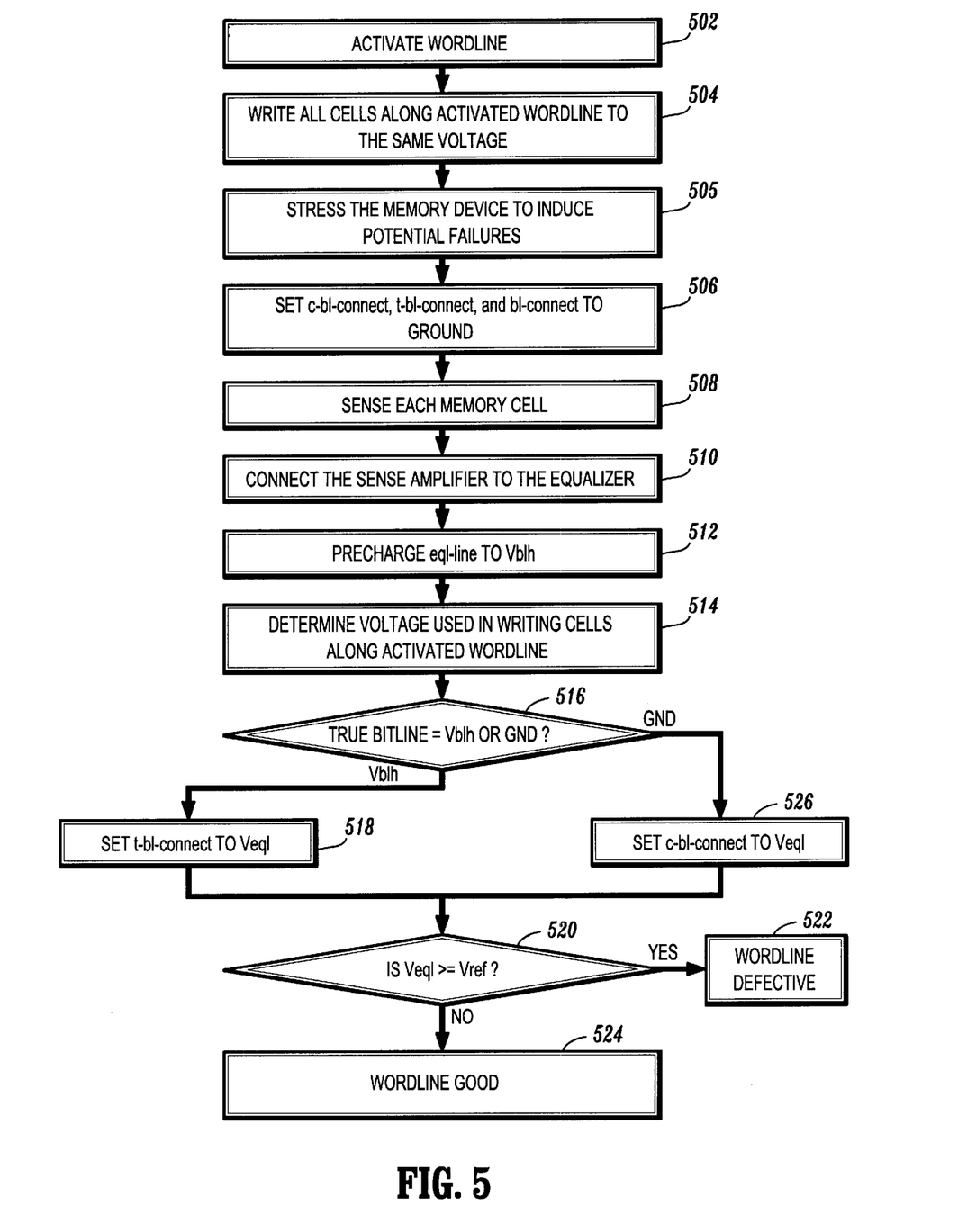
FIG. 5 is a flowchart illustrating a method for testing a semiconductor memory device in accordance with the present invention.
Figure 6:
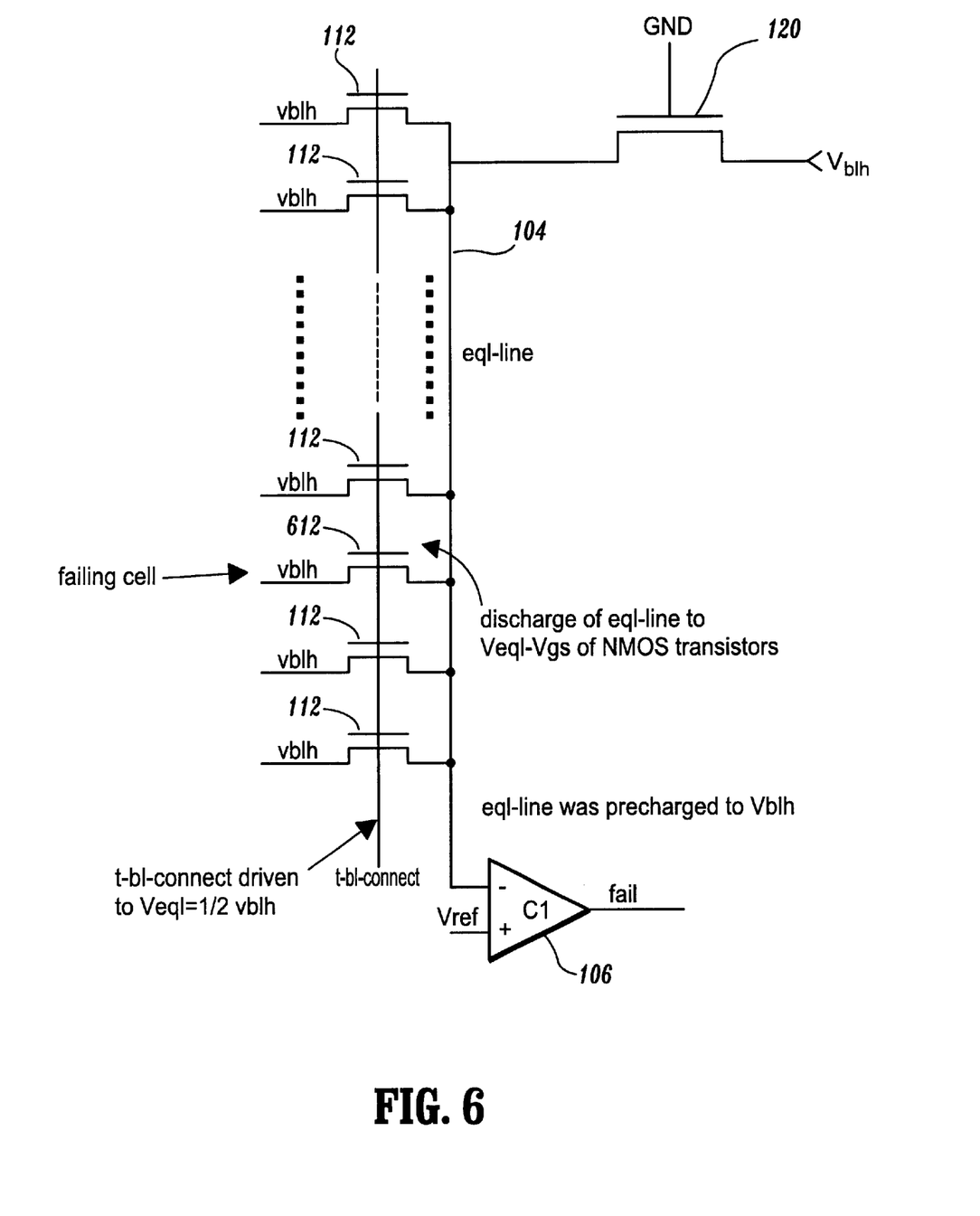
FIG. 6 is a partial schematic diagram of a semiconductor memory device being test according to one embodiment of the present invention.

To use the functionality of the present invention, the memory cells MCs along one wordline WL are written with such a pattern that all true bitlines BLs are expected to have either a high bit line voltage Vblh or all true bitlines BLs have the voltage GND. With reference to FIGS. 5 and 6, the method of the present invention will be described under two scenarios: first where the true bitlines BLs have voltage Vblh, and second, where the true bitlines BLs have a voltage GND. It is to be understood that the method of the present invention tests the entire memory array at one time, but for the purpose of the following illustration the testing of only one wordline will be described.

Referring to FIG. 5, in the first scenario, a testing of the memory device will be conducted where all true bitlines have a voltage Vblh. First, in step 502, a wordline WL is activated by a row decoder to an "H" level. Then, all memory cells MCs along the activated wordline WL are written to such that all true bitlines BLs have the voltage Vblh after sensing. by a sense amplifier SA(step 504). At this time, the memory device is stressed by conventional test methods, to induce potential failures, over a predetermined period of time (step 505).

After the predetermined period has expired, lines c-bl-connect, t-bl-connect, bl-connect are then set to GND (step 506) and each memory cell MC along the wordline WL is sensed (step 508). Next, the sense amplifier SA is connected to the equalizer circuit, in step 510. (Conventionally, select transistors, not shown in the figures, are available in a sense amplifier for this purpose.) The equalizing line 104 is then precharged to Vblh by activating blh-enable of tri-state register T2 for a predetermined period of time and then disabling blh-enable again such that the equalizing line 104 is not actively driven (step 512). Depending on whether the true bit line or complement bit line was supplied with voltage Vblh (step 514) equalizer voltage Veql will be supplied to either the second or third connection line, t-bl-connect or c- bl-connect respectively. Here, the equalizer voltage Veql, which is ½ Vblh, is then supplied to t-bl-connect (step 518).

In the case where all memory cells MCs are working correctly and thus all true bitlines BL have the level Vblh, no NMOS transistor will be switched on since a gate to source voltage Vgs is negative for all transistors and the equalizing line 104 will stay at ~VBLH. In the case where one or more memory cells MCs are defective as shown in FIG. 6, the corresponding true bitlines will be at GND and therefore the NMOS transistor 612 will also be at GND and the equalizing line 104 will be open such that the equalizing line 104 will be discharged until it reaches the level Veql-Vgs where the other NMOS transistors open. It is to be understood that the transistors shown in FIG. 6 are the second transistors 112 of each equalizer circuit 102.

The voltage of the equalizing line 104 is then compared with a reference voltage Vref (e.g. Veql or a suitable voltage between Vblh and Veql) by the comparator 106 in step 520. Whenever the voltage of equalizing line 104 drops below the reference voltage Vref, e.g., when one or more true bitlines are at GND as described above, the memory cells (or wordline) are deemed defective (step 524). Otherwise, if the equalizing line 104 has a voltage greater than the reference voltage Vref, e.g., Vblh, the memory cells (or wordline) are deemed good (step 524).

The timing may play a role in the test method since the equalizing line 104 is fully floating during the test and therefore may discharge due to parasitic effects. An additional option to avoid this problem is to use a very weak bleeder transistor 120 which actively tries to keep the equalizing line 104 at Vblh. This bleeder transistor must be stronger than any parasitic effect and weaker than a single NMOS transistor of the equalizer circuit 102.

In the second scenario, a testing of the memory device will be conducted where all true bitlines BL have a voltage GND and, therefore, all complement bitlines /BL have a voltage Vblh. Here, step 502 through 516 will be the same as described above and will not be repeated.

In step 526, the equalizer voltage Veql, which is ½ Vblh, is supplied to connection line c-bl-connect (step 526). In the case where all memory cells MCs are working correctly and thus all complement bitlines /BL have the level Vblh, no NMOS transistor will be switched on since the voltage Vgs is negative for all transistors and the equalizing line 104 will stay at ~Vblh. In the case where one or more memory cells MCs are defective, the corresponding complement bitlines /BL will be at GND and therefore the NMOS transistor will also be at GND and the equalizing line 104 will be open such that the equalizing line 104 will be discharged until it reaches the level Veql- Vgs where the other NMOS transistors open.

The voltage of the equalizing line 104 is then compared with a reference voltage Vref (e.g. Veql or a suitable voltage between Vblh and Veql) by the comparator 106. Whenever the equalizing line 104 drops below the reference voltage Vref, e.g., when one or more complement bitlines are at GND, the memory cells MCs (or wordline) are deemed defective. Otherwise, if the equalizing line 104 has a voltage greater than the reference voltage Vref, e.g., Vblh, the memory cells MCs ( or wordline) are deemed good (step 524).

As described above, an optional bleeder transistor may be added to avoid discharge due to parasitic effects.

The usual equalizer circuit functionality can still be achieved in a normal operation mode when the c-bl-connect, t-bl-connect, bl-connect are driven in parallel like the original equalizer circuit 43 of FIG. 3.

The circuit and method of the present invention results in test time reduction. Instead of reading a memory array through all addresses, the method of the present invention only reads through all wordlines of the memory array. For example, in a 256MX16 device, a regular read through the memory array would take 16M read cycles. Using the row compression test mode of the present invention, a read through wordlines would only take 32K read cycles. Even if a 10× overhead is assumed for the test mode, there is still a saving of 50×.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. An equalizer testing circuit for a semiconductor memory device, the equalizer testing circuit comprising:
   at least one equalizer circuit for supplying a first voltage level to one of at least one true bitline or at least one complement bitline during a test mode;
   an equalizing line for coupling a plurality of equalizer circuits along a wordline; and
   a comparator for comparing a second voltage on the equalizing line during the test mode to a reference voltage, wherein if the second voltage is less than the reference voltage, the wordline is defective.

2. The circuit as in claim 1, further comprising a first tri-state register for enabling the equalizer line during the test mode, wherein during a normal operation mode, the first tri-state register supplies an equalizing voltage to the equalizing line and, during a test mode, the first tri-state register supplies no voltage to the equalizer line.

3. The circuit as in claim 2, further comprising a second tri-state register for precharging the equalizing line during the test mode.

4. The circuit as in claim 1, wherein the at least one equalizer circuit includes
   a first transistor coupled between the at least one true bitline and the at least one complement bit line, a gate of the first transistor being coupled to a first connection line;
   a second transistor coupled between the at least one true bitline and a third transistor, a gate of the second transistor being coupled to a second connection line; and
   the third transistor being coupled between the second transistor and the at least one complement bitline, a gate of the third transistor being coupled to a third connection line.

5. The circuit as in claim 4, wherein during a normal operation mode, the first connection line, second connection line and third connection line are shorted together.

6. The circuit as in claim 4, wherein during the test mode, if the first voltage is supplied to the at least one true bitline, an equalizing voltage is applied to the second connection line.

7. The circuit as in claim 6, wherein the equalizing voltage is one-half the first voltage supplied to the at least one true bitline.

8. The circuit as in claim 4, wherein during the test mode, if the first voltage is supplied to the at least one complement bitline, an equalizing voltage is applied to the third connection line.

9. The circuit as in claim 8, wherein the equalizing voltage is one-half the first voltage supplied to the at least one complement bitline.

10. The circuit as in claim 1, further comprising a bleeder transistor coupled between the equalizing line and the first voltage for maintaining the equalizing line at the first voltage.

11. A semiconductor memory device comprising:
    a memory cell array including a plurality of wordlines, a plurality of bitlines, and a plurality of memory cells each being located at intersections of the wordlines and the bitlines;
    a row decoder circuit for selecting one of the wordlines in response to a row address;
    a column decoder circuit for selecting at least one of pairs of the bitlines in response to a column address;
    a switching circuit for connecting a bitline pair selected by the column decoder circuit with a corresponding sense amplifier; and
    an equalizer testing circuit including
       at least one equalizer circuit for supplying a first voltage level to one of at least one true bitline or at least one complement bitline during a test mode;
       an equalizing line for coupling a plurality of equalizer circuits along a wordline; and
       a comparator for comparing a second voltage on the equalizing line during the test mode to a reference voltage, wherein if the second voltage is less than the reference voltage, the wordline is defective.

12. The semiconductor memory device as in claim 11, further comprising a first tri-state register for enabling the equalizer line during the test mode, wherein during a normal operation mode, the first tri-state register supplies an equalizing voltage to the equalizing line and, during a test mode, the first tri-state register supplies no voltage to the equalizer line.

13. The semiconductor memory device as in claim 12, further comprising a second tri-state register for precharging the equalizing line during the test mode.

14. The semiconductor memory device as in claim 11, wherein the at least one equalizer circuit includes
    a first transistor coupled between the at least one true bitline and the at least one complement bit line, a gate of the first transistor being coupled to a first connection line;
    a second transistor coupled between the at least one true bitline and a third transistor, a gate of the second transistor being coupled to a second connection line; and
    the third transistor being coupled between the second transistor and the at least one complement bitline, a gate of the third transistor being coupled to a third connection line.

15. The semiconductor memory device as in claim 14, wherein during a normal operation mode, the first connection line, second connection line and third connection line are shorted together.

16. The semiconductor memory device as in claim 14, wherein during the test mode, if the first voltage is supplied to the at least one true bitline, an equalizing voltage is applied to the second connection line.

17. The semiconductor memory device as in claim 14, wherein during the test mode, if the first voltage is supplied to the at least one complement bitline, an equalizing voltage is applied to the third connection line.

18. A method for testing a semiconductor memory device comprising the steps of:
    activating a wordline such that all true bitlines or complement bitlines along the wordline have a first voltage;
    connecting a sense amplifier to an equalizing test circuit;
    precharging an equalizing line to the first voltage;
    supplying a second voltage to the equalizing test circuit; and
    comparing a voltage of the equalizing line to a reference voltage, wherein if the equalizing line voltage is less than the reference voltage, the wordline is defective.

19. The method as in claim 18, wherein the equalizing test circuit includes
    a first transistor coupled between the at least one true bitline and the at least one complement bit line, a gate of the first transistor being coupled to a first connection line;
    a second transistor coupled between the at least one true bitline and a third transistor, a gate of the second transistor being coupled to a second connection line; and
    the third transistor being coupled between the second transistor and the at least one complement bitline, a gate of the third transistor being coupled to a third connection line.

20. The method as in claim 19, further comprising the step of, when in a normal operation mode, setting the first connection line, second connection line and third connection to ground voltage.

21. The method as in claim 19, wherein if the first voltage is supplied to the true bitlines, supplying the second voltage to the second connection line of the equalizing test circuit.

22. The method as in claim 19, wherein if the first voltage is supplied to the complement bitlines, supplying the second voltage to the third connection line of the equalizing test circuit.

23. The method as in claim 18, wherein the second voltage is one-half the first voltage.

24. The method as in claim 18, further comprising the step of stressing the semiconductor memory device to induce potential failures.

* * * * *